United States Patent
Guth et al.

(10) Patent No.: US 8,415,207 B2
(45) Date of Patent: Apr. 9, 2013

(54) MODULE INCLUDING A SINTERED JOINT BONDING A SEMICONDUCTOR CHIP TO A COPPER SURFACE

(75) Inventors: Karsten Guth, Soest (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/591,607

(22) Filed: Aug. 22, 2012

(65) Prior Publication Data

US 2012/0312864 A1    Dec. 13, 2012

Related U.S. Application Data

(62) Division of application No. 12/031,377, filed on Feb. 14, 2008, now Pat. No. 8,253,233.

(51) Int. Cl.
 *H01L 21/00* (2006.01)

(52) U.S. Cl. ........ 438/125; 257/691; 257/703; 257/706; 257/707; 257/764; 257/714; 257/762; 257/705

(58) Field of Classification Search .................. 257/703, 257/706, 707, 705, 762, 714, 764, 691; 438/125
See application file for complete search history.

(56) References Cited

U.S. PATENT DOCUMENTS

| | | | |
|---|---|---|---|
| 4,853,252 A | 8/1989 | Fraenkel et al. | |
| 4,952,537 A | 8/1990 | Hayashi et al. | |
| 5,654,586 A | 8/1997 | Schwarzbauer | |
| 5,675,181 A | 10/1997 | Nishiura et al. | |
| 5,869,890 A | 2/1999 | Nishiura et al. | |
| 6,124,635 A | 9/2000 | Kuwabara | |
| 6,812,559 B2 | 11/2004 | Palm et al. | |
| 2002/0145195 A1 | 10/2002 | Okamoto et al. | |
| 2002/0155661 A1* | 10/2002 | Massingill et al. | ........... 438/244 |
| 2004/0004209 A1 | 1/2004 | Matsuba et al. | |
| 2004/0031545 A1 | 2/2004 | Okamoto et al. | |
| 2006/0157862 A1 | 7/2006 | Nishimura et al. | |
| 2006/0183625 A1* | 8/2006 | Miyahara | ..................... 501/98.4 |
| 2008/0230905 A1 | 9/2008 | Guth et al. | |

FOREIGN PATENT DOCUMENTS

| | | |
|---|---|---|
| DE | 3414065 | 12/1985 |
| EP | 0242626 | 12/1991 |
| EP | 0330895 | 12/1994 |
| EP | 790644 | 8/1997 |
| JP | 2003297834 | 10/2003 |
| JP | 2006202586 | 8/2006 |
| JP | 2006352080 | 12/2006 |
| WO | 2005079353 | 9/2005 |

OTHER PUBLICATIONS

J. Bai et al., "Processing and Characterization of Nanosilver Pastes for Die-Attaching SiC Devices", IEEE Transaction on Electronics Packaging Manufacturing, vol. 30, No. 4, Oct. 2007, pp. 241-245.
Non-Final Office Action mailed Feb. 9, 2011 in U.S. Appl. No. 12/031,377.

(Continued)

*Primary Examiner* — Telly Green
(74) *Attorney, Agent, or Firm* — Dicke, Billig & Czaja, PLLC

(57) ABSTRACT

A module includes a substrate including a first copper surface and a semiconductor chip. The module includes a first sintered joint bonding the semiconductor chip directly to the first copper surface.

19 Claims, 3 Drawing Sheets

OTHER PUBLICATIONS

Non-Final Office Action mailed Feb. 1, 2012 in U.S. Appl. No. 12/031,377.
Non-Final Office Action mailed Aug. 18, 2011 in U.S. Appl. No. 12/031,377.
Final Office Action mailed May 24, 2011 in U.S. Appl. No. 12/031,377.
Final Office Action mailed Oct. 27, 2010 in U.S. Appl. No. 12/031,377.
Non-Final Office Action mailed Jun. 9, 2010 in U.S. Appl. No. 12/031,377.

* cited by examiner

MODULE INCLUDING A SINTERED JOINT BONDING A SEMICONDUCTOR CHIP TO A COPPER SURFACE

CROSS-REFERENCE TO RELATED APPLICATIONS

This Utility Patent Application is a divisional application of U.S. application Ser. No. 12/031,377, filed Feb. 14, 2008, which is incorporated herein by reference.

Background

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. Some power electronic modules also include additional semiconductor diodes (i.e., free-wheeling diodes) in the semiconductor package for overvoltage protection.

In general, two different power electronic module designs are used. One design is for higher power applications and the other design is for lower power applications. For higher power applications, a power electronic module typically includes several semiconductor chips integrated on a single substrate. The substrate typically includes an insulating ceramic substrate, such as $Al_2O_3$, AlN, $Si_3N_4$, or other suitable material, to insulate the power electronic module. At least the top side of the ceramic substrate is metallized with either pure or plated Cu, Al, or other suitable material to provide electrical and mechanical contacts for the semiconductor chips. The metal layer is typically bonded to the ceramic substrate using a direct copper bonding (DCB) or an active metal brazing (AMB) process.

Typically, soft soldering with Sn—Pb, Sn—Ag, Sn—Ag—Cu, or another suitable solder alloy is used for joining a semiconductor chip to a metallized ceramic substrate. Typically, several substrates are combined onto a metal baseplate. In this case, the backside of the ceramic substrate is also metallized with either pure or plated Cu, Al, or other suitable material for joining the substrates to the metal baseplate. To join the substrates to the metal baseplate, soft soldering with Sn—Pb, Sn—Ag, Sn—Ag—Cu, or another suitable solder alloy is typically used.

For lower power applications, instead of ceramic substrates, leadframe substrates (e.g., pure Cu substrates) are typically used. Depending upon the application, the leadframe substrates are typically plated with Ni, Ag, Au, and/or Pd. Typically, soft soldering with Sn—Pb, Sn—Ag, Sn—Ag—Cu, or another suitable solder alloy is used for joining a semiconductor chip to a leadframe substrate.

For high temperature applications, the low melting point of the solder joints ($T_m$=180° C.-220° C.) becomes a critical parameter for power electronic modules. During operation of power electronic modules, the areas underneath the semiconductor chips are exposed to high temperatures. In these areas, the ambient air temperature is superposed by the heat that is dissipated inside the semiconductor chip. This leads to a thermal cycling during operation of the power electronic modules. Typically, with respect to thermal cycling reliability, a reliable function of a solder joint cannot be guaranteed above 150° C. Above 150° C., cracks may form inside the solder region after a few thermal cycles. The cracks can easily spread over the entire solder region and lead to the failure of the power electronic module.

With the increasing desire to use power electronics in harsh environments (e.g., automotive applications) and the ongoing integration of semiconductor chips, the externally and internally dissipated heat continues to increase. Therefore, there is a growing demand for high temperature power electronic modules capable of operating with internal and external temperatures up to and exceeding 200° C. In addition, to lower the cost of high temperature power electronic modules, noble metal surfaces for joining semiconductor chips to substrates and noble metal surfaces for joining substrates to metal baseplates should be avoided.

For these and other reasons, there is a need for the present invention.

SUMMARY

One embodiment provides a module. The module includes a substrate including a first copper surface and a semiconductor chip. The module includes a first sintered joint bonding the semiconductor chip directly to the first copper surface.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
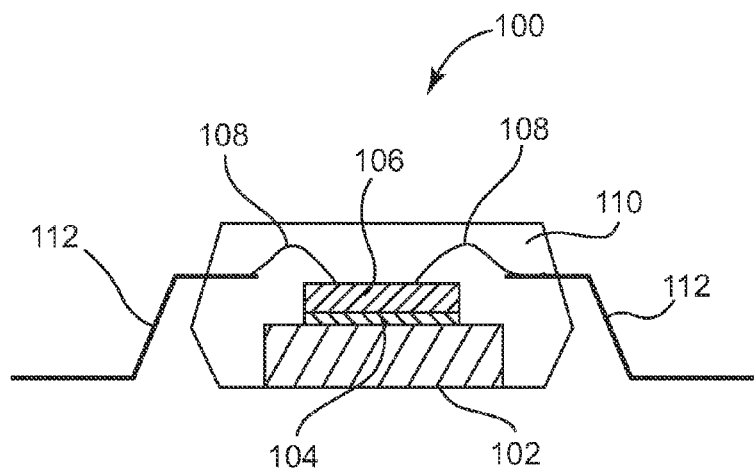
FIG. 1 illustrates a cross-sectional view of one embodiment of a module.

FIG. 1 illustrates a cross-sectional view of one embodiment of a module 100. In one embodiment, module 100 is a high temperature (i.e., up to and exceeding 200° C.) low power electronic module. Power electronic module 100 includes a leadframe substrate 102, a sintered joint 104, a semiconductor chip 106, bond wires 108, leads 112, and a housing 110. Leadframe substrate 102 includes Cu or another suitable material. Sintered joint 104 joins Cu leadframe substrate 102 directly to semiconductor chip 106 without using a noble metal layer between Cu leadframe substrate 102 and semiconductor chip 106. By not using a noble metal layer, the cost of power electronic module 100 is reduced compared to typical high temperature power electronic modules.

As used herein, the term "electrically coupled" is not meant to mean that the elements must be directly coupled together and intervening elements may be provided between the "electrically coupled" elements.

Semiconductor chip 106 is electrically coupled to leads 112 through bond wires 108. Bond wires 108 include Al, Cu, Al—Mg, Au, or another suitable material. In one embodiment, bond wires 108 are bonded to semiconductor chip 106 and leads 112 using ultrasonic wire bonding. In one embodiment, leadframe substrate 102 has a thickness within the range of 125 nm-200 nm. Leadframe substrate 102 is joined to semiconductor chip 106 using a low temperature joining (LTJ) process to provide sintered joint 104. Sintered joint 104 is formed without oxidizing the surface of Cu leadframe substrate 102. Housing 110 includes a mould material or another suitable material. Housing 110 surrounds leadframe substrate 102, sintered joint 104, semiconductor chip 106, bond wires 108, and portions of leads 112.

Figure 2:
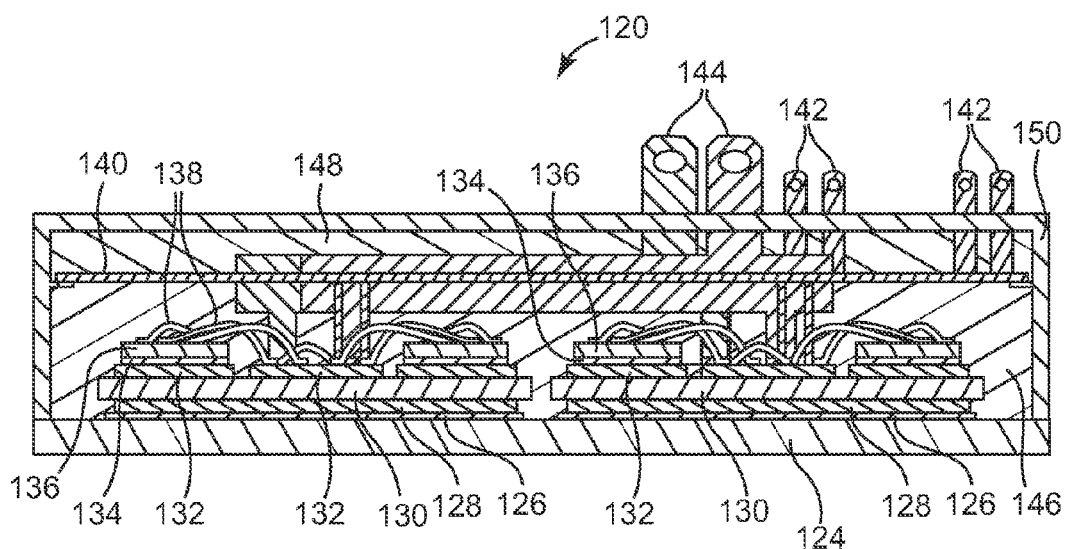
FIG. 2 illustrates a cross-sectional view of another embodiment of a module.

FIG. 2 illustrates a cross-sectional view of another embodiment of a module 120. In one embodiment, module 120 is a high temperature (i.e., up to and exceeding 200° C.) high power electronic module. Power electronic module 120 includes a metal baseplate 124, sintered joints 126, metalized ceramic substrates 130 including metal surfaces or layers 128 and 132, sintered joints 134, semiconductor chips 136, bond wires 138, circuit board 140, control contacts 142, power contacts 144, potting 146 and 148, and housing 150.

Metal layers 128 and 132 include Cu or another suitable material. Sintered joints 126 join Cu layers 128 directly to metal baseplate 124 without using a noble metal layer between Cu layers 128 and metal baseplate 124. Sintered joints 134 join Cu layers 132 directly to semiconductor chips 136 without using a noble metal layer between Cu layers 132 and semiconductor chips 136. By not using noble metal layers, the cost of power electronic module 120 is reduced compared to typical high temperature power electronic modules.

Semiconductor chips 136 are electrically coupled to Cu layers 132 through bond wires 138. Bond wires 138 include Al, Cu, Al—Mg, Au, or another suitable material. In one embodiment, bond wires 138 are bonded to semiconductor chips 136 and Cu layers 132 using ultrasonic wire bonding. Cu layers 132 are electrically coupled to circuit board 140 and power contacts 144. Circuit board 140 is electrically coupled to control contacts 142.

Housing 150 encloses sintered joints 126, metallized ceramic substrates 130 including Cu layers 128 and 132, sintered joints 134, semiconductor chips 136, bond wires 138, circuit board 140, portions of control contacts 142, and portions of power contacts 144. Housing 150 includes technical plastics or another suitable material. Housing 150 is joined to metal baseplate 124. In one embodiment, a single metallized ceramic substrate 130 is used such that metal baseplate 124 is excluded and housing 150 is joined directly to the single metallized ceramic substrate 130.

Potting material 146 fills areas below circuit board 140 within housing 150 around sintered joints 126, metallized ceramic substrates 130 including Cu layers 128 and 132, sintered joints 134, semiconductor chips 136, and bond wires 138. Potting material 148 fills the area above circuit board 150 within housing 150 around portions of control contacts 142 and portions of power contacts 144. Potting material 146 and 148 includes silicone gel or another suitable material. Potting material 146 and 148 prevents damage to power electronic module 120 by dielectrical breakdown.

The following FIGS. 3-6 illustrate embodiments for low temperature joining of a semiconductor chip to a substrate including a Cu surface, such as joining semiconductor chip 106 to leadframe substrate 102 as previously described and illustrated with reference to FIG. 1 or joining semiconductor chip 136 to Cu layer 132 as previously described and illustrated with reference to FIG. 2. A similar process can also be used for low temperature joining of a metallized substrate including a Cu layer to a metal baseplate, such as joining Cu layer 128 to metal baseplate 124 as previously described and illustrated with reference to FIG. 2.

Figure 3:
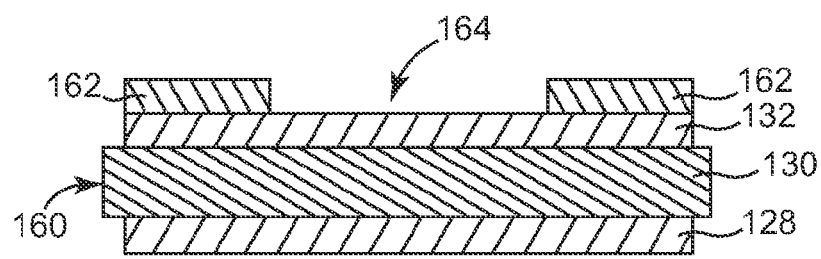
FIG. 3 illustrates a cross-sectional view of one embodiment of a masked substrate.

FIG. 3 illustrates a cross-sectional view of one embodiment of a masked substrate 160. Masked substrate 160 includes a metallized ceramic substrate 130 including a bottom Cu layer 128 and a top Cu layer 132, and a mask 162. Bottom Cu layer 128 is bonded to the bottom of ceramic substrate 130. Top Cu layer 132 is bonded to the top of ceramic substrate 130. Cu layers 128 and 132 are bonded to ceramic substrate 130 using a direct copper bonding (DCB) process, an active metal brazing (AMB) process, or another suitable process. Ceramic substrate 130 includes $Al_2O_3$, MN, $Si_3N_4$, or other suitable material. Mask 162 is formed on Cu layer 132 to expose a portion 164 of Cu layer 132. Mask 162 includes a photosensitive material or another suitable material.

Figure 4:
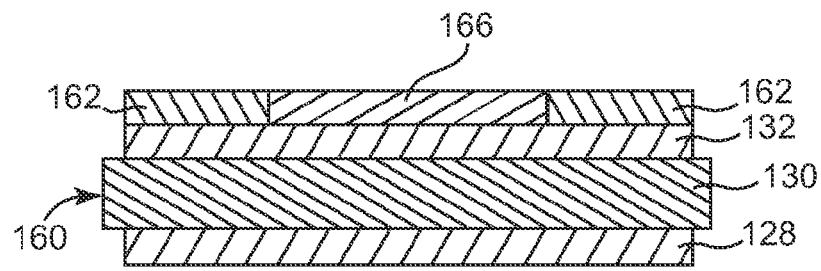
FIG. 4 illustrates a cross-sectional view of one embodiment of the masked substrate and a bonding paste or slurry.

FIG. 4 illustrates a cross-sectional view of one embodiment of the masked substrate 160 and a bonding paste or slurry 166. A bonding paste or slurry 166 is applied over the exposed unmasked portion 164 of Cu layer 132. Bonding paste or slurry 166 provides a sticky surface for pre-positioning semiconductor chips. The portions of Cu layer 132 covered by bonding paste or slurry 166 are protected against oxidation during sintering.

Bonding paste or slurry 166 includes organic components that decompose at temperatures within a range of 50° C.-200° C. to provide decomposition products without residues. In addition, the decomposition products do not have any oxidizing effect on the surface of Cu layer 132. The decomposition products also do not have any passivation effect on the surface of Cu layer 132. The decomposition of the organic components is slow and uniform rather than abrupt. Further, the gaseous components released during sintering do not increase the porosity of the sinter layer.

Bonding paste or slurry 166 includes Ag particles, Au particles, Cu particles, or another suitable material. The particles have a grain size within a range between 1 nm-20 μm, such as 1 nm-1000 nm, 1 nm-100 nm, 1 μm-15 μm, 1 μm-5 μm, or less than 500 nm. In one embodiment, bonding paste or slurry 166 includes additional components with surface activating properties. The components with surface activating properties include resins, such as colophonium or synthetic substitutes, organic acids, which develop reducing properties with increasing temperature, or other suitable components.

Figure 5:
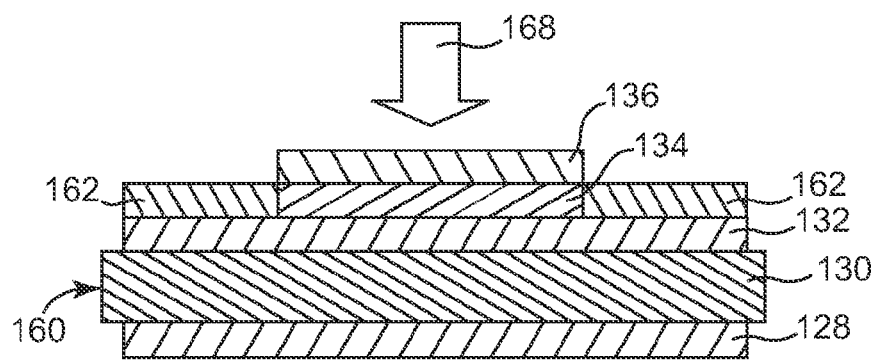
FIG. 5 illustrates a cross-sectional view of one embodiment of the masked substrate, a sintered joint, and a semiconductor chip after sintering.

FIG. 5 illustrates a cross-sectional view of one embodiment of the masked substrate 160, a sintered joint 134, and a semiconductor chip 136 after sintering. A semiconductor chip 136 is placed on bonding paste or slurry 166. In one embodiment, mask 162 is removed and the exposed portions of Cu layer 132 are covered with a protective layer to protect the surface of Cu layer 132 from oxidation during the sintering process. The protective layer includes a sticky foil, such as imid or Teflon®, a photoactive foil, a thin organic material layer, or another suitable protective layer. Mask 162 or the protective layer provides oxidation protection for the surface of Cu layer 132 up to the sintering process temperature.

Semiconductor chip 136 is joined to Cu layer 132 in a heatable press. Depending on the particle size of the material in bonding paste or slurry 166, temperatures between 100° C.-450° C., such as between 200° C.-400° C., and pressures up to 40 MPa as indicated by arrow 168 are used for sintering to form sintered joint 134. In one embodiment, for particles having a diameter between 1 μm-15 μm, temperatures between 200° C.-250° C. and pressures between 20 MPa-40 MPa are used for sintering to form sintered joint 134.

Figure 6:
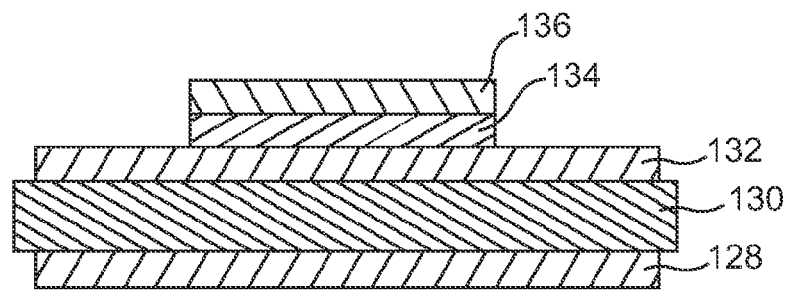
FIG. 6 illustrates a cross-sectional view of one embodiment of the substrate, the sintered joint, and the semiconductor chip after removing the mask.

FIG. 6 illustrates a cross-sectional view of one embodiment of the metallized ceramic substrate 130 including Cu layers 128 and 132, sintered joint 134, and semiconductor chip 136 after removing mask 162 or the protective layer. Mask 162 or the protective layer is removed to expose Cu layer 132. The surface of Cu layer 132 was protected during the sintering process from oxidation. Therefore, no additional noble metal layers are used to protect Cu layer 132 from oxidation, thereby reducing the cost of metallized ceramic substrate 130 including Cu layers 128 and 132.

Figure 7:
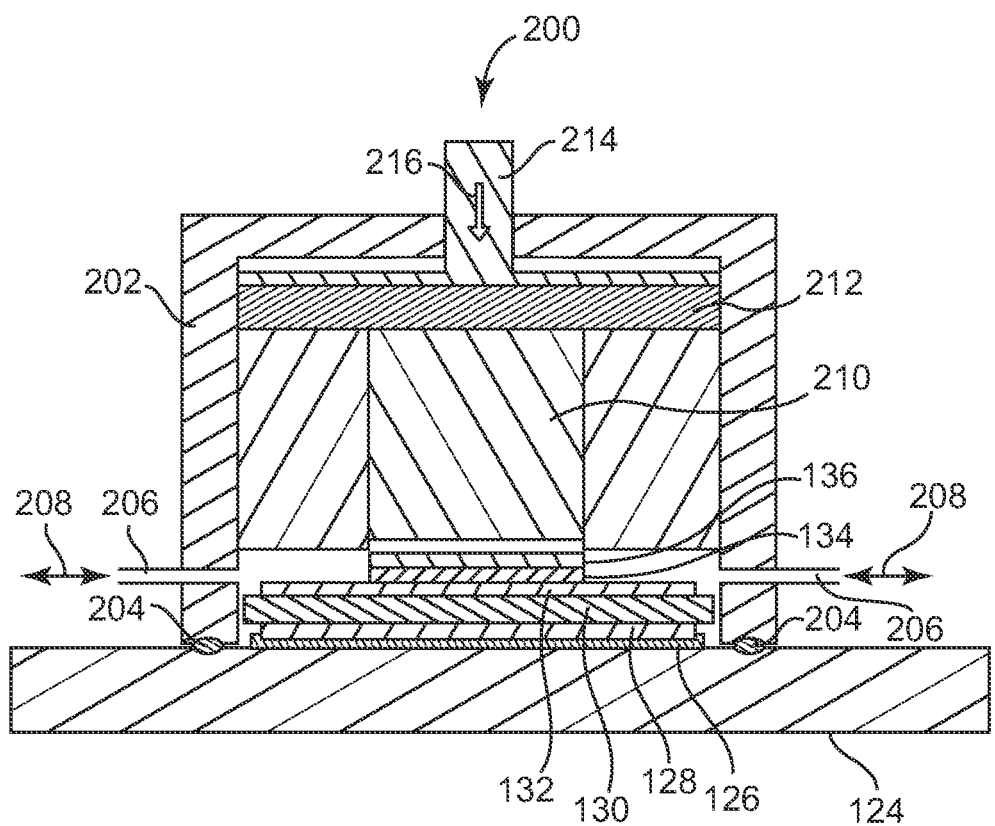
FIG. 7 illustrates a cross-sectional view of one embodiment of a low temperature joining (LTJ) tool.

FIG. 7 illustrates a cross-sectional view of one embodiment of a low temperature joining (LTJ) tool 200. Tool 200 includes a housing 202, a seal 204, gas inlets/outlets 206, a stamp 210, a soft pad 212, and a pressure axle 214. In one embodiment, tool 200 is a vacuum tool. In other embodiments, tool 200 is not a vacuum tool as long as the atmosphere is non-oxidizing. Tool 200 is a sintering tool that prevents the oxidation of the surfaces of components being joined. In one embodiment, tool 200 includes an airtight housing 202 that seals the sample when the press is closed. Tool 200 includes gas inlets/outlets 206 to evacuate air and/or to introduce a non-oxidizing atmosphere as indicated by arrows 208. In one embodiment, the non-oxidizing atmosphere includes an inert gas atmosphere, a reducing atmosphere, or another suitable atmosphere. In one embodiment, the reducing atmosphere includes a forming gas, formic acid, or another suitable gas. A reducing atmosphere cleans and protects exposed portions of Cu layer 132.

The non-oxidizing atmosphere protects Cu layer 132 from oxidation during the sintering process. Therefore, mask 162 or the protective layer previously described and illustrated with reference to FIG. 5 can be excluded during the sintering process when using tool 200. To join semiconductor chip 136 to Cu layer 132 and Cu layer 128 to metal baseplate 124, first a bonding paste or slurry is applied to metal baseplate 124 and/or Cu layer 128. Metallized ceramic substrate 130 including Cu layers 128 and 132 is then placed on the bonding paste or slurry on metal baseplate 124.

Next, bonding paste or slurry is applied to unmasked portions of Cu layer 132 as previously described and illustrated with reference to FIG. 4 and/or to semiconductor chip 136. Semiconductor chip 136 is then placed on the bonding paste or slurry on metalized ceramic substrate 130. Housing 202 is placed over semiconductor chip 136 and metalized ceramic substrate 130 and sealed to metal baseplate 124 with seal 204. Tool 200 heats the bonding paste or slurry and pressure axle 214 applies pressure as indicated by arrow 216 to soft pad 212. Soft pad 212 evenly spreads the force from pressure axle 214. Soft pad 212 forces stamp 210 onto semiconductor chip 136 to form sintered joint 134 joining semiconductor chip 136 to Cu layer 132 and sintered joint 126 joining Cu layer 128 to metal baseplate 124.

In one embodiment, the bonding paste or slurry includes Ag, Au, Cu, or another suitable material. Depending on the particle size of the material in the bonding paste or slurry, tool 200 heats the bonding paste or slurry to a temperature within the range of 100° C.-450° C., such as 200° C.-400° C., and applies a pressure up to 40 MPa through pressure axle 214 on semiconductor chip 136 to form sintered joint 134 and sintered joint 126. In one embodiment, for Ag particles having a diameter between 1 μm-15 μm, tool 200 heats the bonding paste or slurry to a temperature within the range of 200° C.-250° C. and applies a pressure between 20 MPa-40 MPa to form sintered joint 134 and sintered joint 126.

Embodiments provide low temperature joining of Cu substrates or Cu layers to semiconductor chips, metal baseplates, or other suitable components. The surface of the Cu is protected from oxidation during sintering without using noble metal layers over the Cu. In this way, the joined components are produced at lower cost than typical low temperature joined components and are suitable for high temperature applications up to and exceeding 200° C.

While the illustrated embodiments substantially focused on power electronic modules, the embodiments are applicable to any circuit where low temperature joining of components to Cu is desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a module, the method comprising:
providing a substrate including a copper surface;
masking a portion of the copper surface;
applying a bonding paste to an unmasked portion of the copper surface;
applying a die to the bonding paste; and
sintering the bonding paste to provide a joint joining the die to the copper surface.

2. The method of claim 1, wherein applying the bonding paste comprises applying a bonding paste comprising one of Ag, Au, and Cu.

3. The method of claim 1, wherein applying the bonding paste comprises applying a bonding paste comprising particles having a grain size less than 500 nm.

4. The method of claim 1, wherein applying the bonding paste comprises applying a bonding paste comprising particles having a grain size within a range of 1 nm-20 μm.

5. The method of claim 1, wherein applying the bonding paste comprises applying a bonding paste having a sticky surface at room temperature.

6. The method of claim 1, wherein applying the bonding paste comprises applying a bonding paste including organic components that decompose within a temperature range between 50° C.-200° C. without residues and with no oxidizing effect.

7. The method of claim 1, wherein applying the bonding paste comprises applying a bonding paste including organic components that decompose with no passivation effect on the copper surface.

8. The method of claim 1, wherein applying the bonding paste comprises applying a bonding paste including one of a resin and an organic acid.

9. The method of claim 1, further comprising:
removing the mask after applying the bonding paste; and
applying a protective layer to exposed portions of the copper surface.

10. The method of claim 9, wherein applying the protective layer comprises applying one of a sticky foil and an organic protection layer.

11. The method of claim 1, wherein sintering comprises sintering at a temperature within a range of 100° C.-450° C. and at a pressure up to 40 MPa.

12. A method for fabricating a module, the method comprising:
providing a substrate including a copper surface;
applying a bonding paste to a portion of the copper surface;
applying a semiconductor chip to the bonding paste; and
sintering the bonding paste in a non-oxidizing atmosphere to join the die to the copper surface.

13. The method of claim 12, wherein sintering comprises sintering in one of an inert gas atmosphere and a reducing atmosphere.

14. The method of claim 12, wherein applying the bonding paste comprises applying a bonding paste comprising one of Ag, Au, and Cu.

15. The method of claim 12, wherein providing the substrate comprises providing a leadframe substrate.

16. The method of claim 12, wherein providing the substrate comprises providing a ceramic substrate bonded to a copper layer.

17. The method of claim 1, wherein masking the portion of the copper surface prevents oxidation of the masked portion of the copper surface during the sintering.

18. The method of claim 9, wherein applying the protective layer to exposed portions of the copper surface prevents oxidation of the copper surface during the sintering.

19. The method of claim 12, wherein the non-oxidizing atmosphere prevents oxidation of the copper surface during the sintering.

* * * * *